United States Patent
Mizuta

[11] Patent Number: 6,043,671
[45] Date of Patent: Mar. 28, 2000

[54] SEMICONDUCTOR INSPECTION DEVICE WITH GUIDE MEMBER FOR PROBE NEEDLE FOR PROBE CARD AND METHOD OF CONTROLLING THE SAME

[75] Inventor: Masaharu Mizuta, Hyogo, Japan

[73] Assignee: Mitsubishi Denki Kabushiki Kaisha, Tokyo, Japan

[21] Appl. No.: 09/058,892

[22] Filed: Apr. 13, 1998

[30] Foreign Application Priority Data

Nov. 11, 1997 [JP] Japan ..................................... 9-308292

[51] Int. Cl.⁷ .................................................... G01R 31/26
[52] U.S. Cl. ........................ 324/765; 324/754; 324/758; 324/760
[58] Field of Search ..................... 324/754, 755, 324/757, 758, 760, 765

[56] References Cited

U.S. PATENT DOCUMENTS

| | | | |
|---|---|---|---|
| 5,124,639 | 6/1992 | Carlin et al. ............................. | 324/760 |
| 5,210,485 | 5/1993 | Kreiger et al. .......................... | 324/758 |
| 5,325,052 | 6/1994 | Yamashita ................................ | 324/754 |

FOREIGN PATENT DOCUMENTS

| | | |
|---|---|---|
| 6-163657 | 10/1994 | Japan . |
| 7-2975 | 1/1995 | Japan . |
| 7-98330 | 11/1995 | Japan . |

*Primary Examiner*—Josie Ballato
*Assistant Examiner*—T. R. Sundaram
*Attorney, Agent, or Firm*—McDermott, Will & Emery

[57] ABSTRACT

A semiconductor inspection device and a method of controlling the same are obtained which are capable of preventing any positional displacement of a probe needle of the semiconductor inspection device relative to an electrode of a semiconductor device to be inspected and thus ensuring that the semiconductor device is inspected. The semiconductor inspection device provided with a probe needle for a probe card and a guide plate for positioning the probe needle employs a temperature sensor provided on the probe needle positioning guide plate, a heater for heating the positioning guide plate and a cooling fan for cooling the positioning guide plate and refers to the temperature of the positioning guide plate measured by the temperature sensor to provide ON/OFF control of the heater and the cooling fan by means of a control device.

12 Claims, 6 Drawing Sheets

SEMICONDUCTOR INSPECTION DEVICE WITH GUIDE MEMBER FOR PROBE NEEDLE FOR PROBE CARD AND METHOD OF CONTROLLING THE SAME

BACKGROUND OF THE INVENTION

1. Field of the Invention

The present invention relates to a semiconductor inspection device and a method of controlling the same, and in particular to a semiconductor inspection device having a guide member for a probe needle for a probe card and a method of controlling the same.

2. Description of the Background Art

Conventional processes for manufacturing semiconductor devices includes inspecting electrical characteristics of a semiconductor device formed on a semiconductor substrate. In this inspection step, a probe card is mounted to a device referred to as a prober and a probe needle provided on the probe card is brought into contact with an electrode of a semiconductor device formed on a semiconductor substrate. An electrical signal is then transmitted to the electrode via the probe needle to inspect the electrical characteristics of the semiconductor device.

Meanwhile, with the recent microfabrication and high integration of semiconductor devices, they now have a size of an electrode of approximately 100 μm square and a spacing between electrodes of approximately 100 μm, and electrode size and the spacing between electrodes have thus been reduced.

Such microfabrication of semiconductor devices has rendered it increasingly difficult to position a probe needle to bring the probe needle into contact with an electrode in inspecting a semiconductor device. In order to solve such a problem, a plate member, referred to as a guide member hereinafter, is employed which has an opening at a predetermined position corresponding a position of an electrode formed on a surface of a semiconductor substrate. A probe needle can be inserted into the opening of the guide member to position a probe needle and thus ensure that the probe needle is brought into contact with the electrode via the opening.

Figure 8:
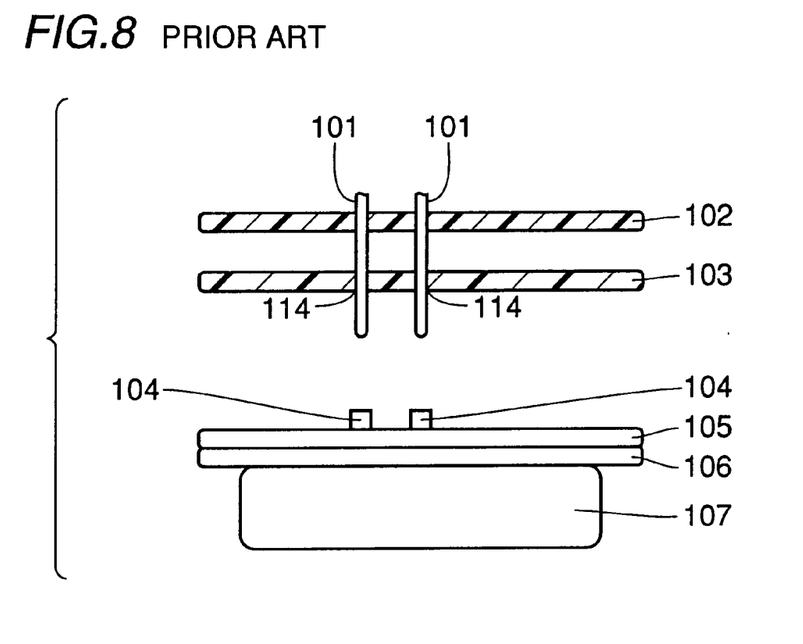
FIG. 8 schematically shows a conventional semiconductor inspection device.
Figure 9:
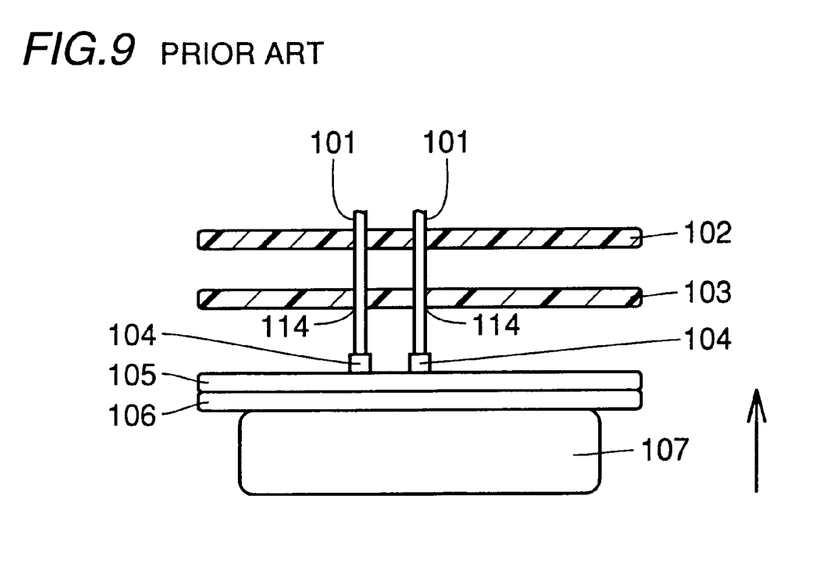
FIG. 9 schematically shows that a probe needle of the conventional semiconductor inspection device shown in FIG. 8 is in contact with an electrode on a semiconductor substrate.

FIGS. 8 and 9 schematically illustrate positioning of a probe needle employing a conventional semiconductor testing device with a guide member in testing a semiconductor device.

The conventional semiconductor testing device shown in FIG. 8 includes a vertical probe needle 101, a guide plate 102 for fixing probe needle 101, a guide plate 103 for positioning probe needle 101, a hot chuck 106 for fixing a semiconductor substrate 105, and a prober support 107. Hot chuck 106 is placed on prober support 107. Semiconductor substrate 105 is fixed on hot chuck 106. Formed on a surface of semiconductor substrate 105 is an electrode 104 of the semiconductor device. Probe needle positioning guide plate 103 is provided in an area located over semiconductor substrate 105 and has an opening 114. Probe needle fixing guide plate 102 is provided in an area located over positioning guide plate 103. Probe needle 101 is fixed at a predetermined region of fixing guide plate 102. Opening 114 is formed at such a region that guide plate 103 is fixed over semiconductor substrate 105 and opening 114 is positioned exactly above electrode 104 of semiconductor substrate 105 with the temperature of guide plate 103 at a room temperature (25° C.).

Then, semiconductor substrate 105 is heated by the hot chuck to a predetermined temperature (80° C.) as a testing condition and is then raised, as shown in FIG. 9, to bring probe needle 101 into contact with electrode 104. An electrical signal is transmitted to an electrode 104 via probe needle 101 to test electrical characteristics of the semiconductor device formed on semiconductor substrate 105.

Thus, electrical characteristics of semiconductor devices have been conventionally tested.

While the temperature of semiconductor substrate 105 in testing a semiconductor device is maintained at 80° C., as shown in FIG. 9, the temperatures of positioning guide plate 103 and fixing guide plate 102 positioned over semiconductor substrate 105 have not conventionally been controlled in a particular manner. Accordingly, the temperatures of guide plates 102 and 103 are changed due to the ambient gas heated by semiconductor substrate 105 and hot chuck 106. The temperature of the ambient gas is influenced by the frequency of the insertion and exit of semiconductor substrate 105, the temperature of the external ambient in inspection, the structure of the testing device used and the like and thus varies in a range of approximately 20° C. to approximately 70° C.

Furthermore, while positioning guide plate 103 (shown in FIG. 8) has been conventionally of resin with a coefficient of linear expansion of approximately $50.0 \times 10^{-6}/°$ C., the coefficient of linear expansion of the silicon which forms semiconductor substrate 105 (shown in FIG. 8) is $2.3 \times 10^{-6}/°$ C. and thus less than 1/20 of that of the resin. Accordingly, when the temperature of semiconductor substrate 105 is set at 80° C. and that of probe needle positioning guide plate 103 is not particularly controlled, as conventional, there will be a significant difference in relative positional displacement in the horizontal direction due to thermal expansion between electrode 104 (shown in FIG. 8) of semiconductor substrate 105 and opening 114 (shown in FIG. 8) of positioning guide plate 103. For example, assuming that opening 114 is formed in positioning guide plate 103 in a room temperature (25° C.) such that opening 114 is aligned with electrode 104 of semiconductor substrate 105 of eight inches in diameter and that the temperature of semiconductor substrate 105 in inspection is set at 80° C. and the temperature of positioning guide plate 103 in the same size as semiconductor substrate 105 is 35° C. in inspection, there will be a positional displacement of at least 60 μm in the horizontal direction of opening 114 of positioning guide plate 103 that is formed to be aligned with electrode 104 relative to electrode 104 formed on semiconductor substrate 105.

Figure 10:
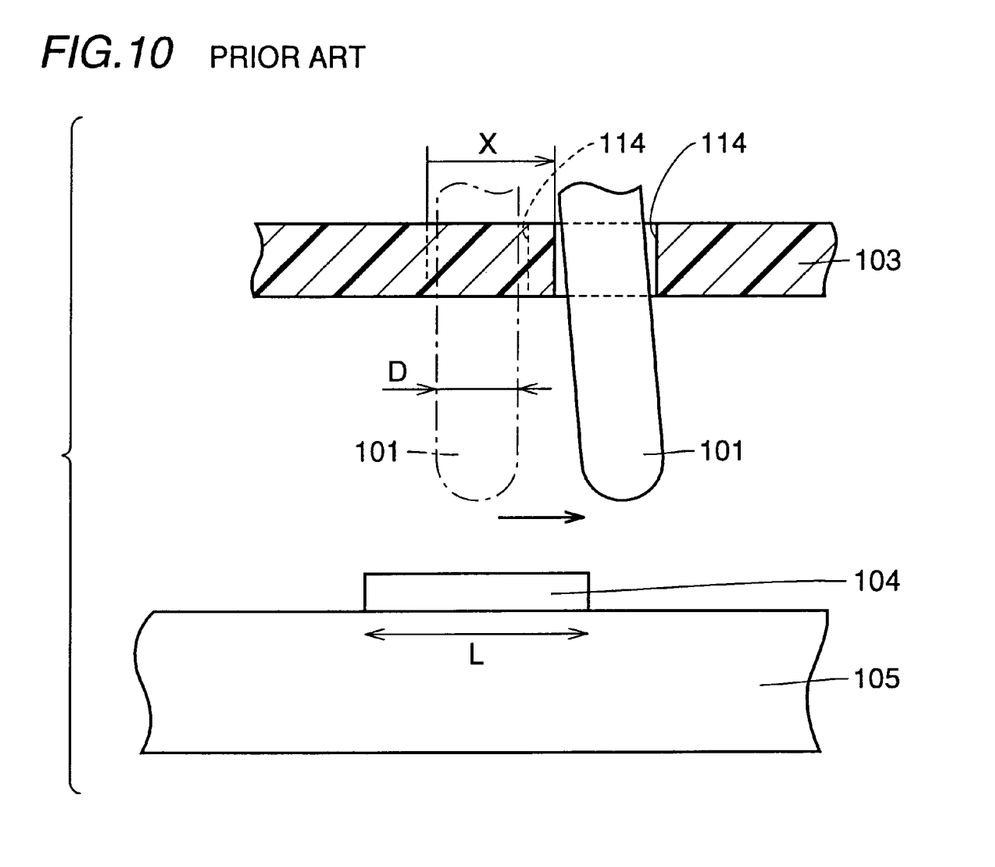
FIG. 10 is a schematic view for illustrating the position of the tip of a probe needle displaced relative to the position of an electrode formed on a semiconductor substrate, due to thermal expansion of the probe needle positioning guide plate in the conventional semiconductor inspection device shown in FIG. 9.

Accordingly, if a length L of one side of electrode 104 formed on a surface of semiconductor substrate 105 is 100 μm, a diameter D of probe needle 101 is 30 μm and if an amount of positional displacement X due to thermal expansion of guide plate 103 relative to semiconductor substrate 105 is 60 μm, then the tip of probe needle 101 is displaced from the position of electrode 104 and probe needle 101 may fail to come in contact with electrode 104, as shown in FIG. 10. Accordingly, electrical signals cannot be transmitted to electrode 104 via probe needle 101 and the semiconductor device cannot be accurately inspected.

SUMMARY OF THE INVENTION

One object of the present invention is to provide a semiconductor inspection device capable of preventing positional displacement of a probe needle of the semiconductor inspection device relative to an electrode of a semiconductor device to ensure that the semiconductor device is inspected.

Another object of the present invention is to provide a method of controlling a semiconductor inspection device capable of preventing positional displacement of a probe needle of the semiconductor inspection device relative to an electrode of a semiconductor device to ensure that the semiconductor device is inspected.

A semiconductor inspection device in one aspect of the present invention includes a probe needle for a probe card, a guide member for positioning the probe needle, and a member which controls the temperature of the guide member. The temperature of the guide member can be controlled to be a set temperature determined depending on the material of the guide member to control positional displacement in the horizontal direction of a guiding portion of the guide member. As such, the horizontal position of an electrode of a semiconductor device to be inspected can be aligned with that of the probe needle guided by the guide member when the semiconductor device is heated in inspection. This ensures that the probe needle for a probe card can be brought into contact with the electrode on the semiconductor device and hence that the semiconductor device can be inspected.

In the semiconductor inspection device in one aspect of the present invention, the temperature controlling member may include a temperature adjusting member which has at least any one of a member for heating the guide member and a member for cooling the guide member. When the coefficient of linear expansion of a material forming the guide member is larger than the coefficient of linear expansion of the semiconductor substrate, the temperature adjusting member can have the member for cooling the guide member to control the temperature of the guide member to reduce any horizontal positional displacement of the guiding portion of the guide member that is caused by thermal expansion. Accordingly, the horizontal position of an electrode of a semiconductor device to be inspected can be aligned with that of the probe needle guided by the guide member when the semiconductor device is heated in inspection. If the coefficient of linear expansion of a material forming the guide member is smaller than the coefficient of linear expansion of the semiconductor substrate, the temperature adjusting member can have the member for heating the guide member to control the temperature of the guide member to increase a horizontal positional displacement of the guiding portion of the guide member that is caused by thermal expansion. Accordingly, the horizontal position of an electrode of a semiconductor device to be inspected can be aligned with that of the probe needle guided by the guide member when the semiconductor device is heated in inspection. This ensures that the probe needle for a probe card can be brought into contact with the electrode formed on the semiconductor substrate and hence that the semiconductor device can be inspected.

The temperature controlling member of the semiconductor device in one aspect of the present invention may include the temperature adjusting member, a member which measures the temperature of the guide member, and a unit which provides ON/OFF control of the temperature adjusting member based on a measured temperature.

Accordingly, the semiconductor inspection device in one aspect of the present invention can precisely control the temperature of the guide member and thus accurately control any positional displacement in the horizontal direction of the guiding portion of the guide member that is caused by thermal expansion of the guiding portion. As such, the horizontal position of an electrode of a semiconductor device to be inspected can be more accurately aligned with that of the probe needle guided by the guide member when the semiconductor device is heated in inspection.

In the semiconductor inspection device in one aspect of the present invention, the ON/OFF control may be provided so that a temperature T1 of the guide member in inspecting the semiconductor device is approximately equal to (T2−T3)×a2/a1+T3, wherein a1 represents the coefficient of linear expansion of a material forming the guide member, a2 represents the coefficient of linear expansion of a semiconductor substrate inspected by the semiconductor inspection device, T2 represents the temperature of the semiconductor substrate in conducting a semiconductor inspection, and T3 represents the temperature of the guide member and semiconductor substrate in aligning the position of an opening formed in the guide member for guiding the probe needle with the position of an electrode formed on the semiconductor substrate. As such, when the temperature of the semiconductor substrate is changed from T3 to temperature T2 of the semiconductor substrate in conducting a semiconductor inspection, any positional displacement in the horizontal direction of the opening of the guide member that is caused by thermal expansion of the guide member can be controlled to be approximately equal to any horizontal positional displacement of the electrode on the semiconductor substrate that is caused by thermal expansion of the semiconductor substrate. Accordingly, the horizontal position of the probe needle guided by the opening can be approximately aligned with that of the electrode. This ensures that the probe needle for a probe card can be brought into contact with the electrode formed on the semiconductor substrate in semiconductor inspection and hence that the semiconductor device can be inspected.

In the semiconductor inspection device in one aspect of the present invention, the temperature controlling member may include the temperature adjusting member, the member which measures the temperature of the guide member, and the unit which provides ON/OFF control of the temperature adjusting member based on the measured temperature, and the temperature adjusting member may include only the member which cools the guide member. When the coefficient of linear expansion of a material forming the guide member is larger than the coefficient of linear expansion of the semiconductor substrate, the temperature of the guide member can be lowered to reduce any positional displacement in the horizontal direction of the guiding portion of the guide member that is caused by thermal expansion of the guide member. As such, the horizontal position of an electrode of a semiconductor device to be inspected can be aligned with that of the probe needle guided by the guide member when the semiconductor device is heated in inspection. This ensures that the probe needle for a probe card can be brought into contact with the electrode of the semiconductor substrate and hence that the semiconductor device can be inspected.

Since the temperature adjusting member includes only the guide member cooling member, the structure of the temperature adjusting member can be simplified, as compared with that which includes both the guide member heating member and the guide member cooling member.

In the semiconductor inspection device in one aspect of the present invention, the temperature controlling member may include the temperature adjusting member, the member which measures the temperature of the guide member, and the unit which provides ON/OFF control of the temperature adjusting member based on a temperature measured. Furthermore, the temperature measuring member may include a temperature sensor and the guide member cooling member may include a cooling fan. The temperature sensor can measure the temperature of the guide member and the ON/OFF control of the cooling fan can be provided according to the measured temperature to precisely control the temperature of the guide member and thus accurately control any positional displacement in the horizontal direction of the guiding portion of the guide member that is caused by thermal expansion of the guide member. Accordingly, the horizontal position of an electrode of a semiconductor device to be inspected can be more precisely aligned with that of the probe needle guided by the guide member when the semiconductor device is heated in inspection. This ensures that the probe needle for a probe card can be brought into contact with the electrode of the semiconductor device and hence that the semiconductor device can be inspected accurately.

In the semiconductor device in one aspect of the present invention, the temperature controlling member may include the temperature adjusting member, the member which measures the temperature of the guide member and a unit which provides ON/OFF control of the temperature adjusting member based on a temperature measured, and the temperature adjusting member may include only the guide member heating member. When the coefficient of linear expansion of a material forming the guide member is smaller than the coefficient of linear expansion of the semiconductor substrate, the guide member heating member can raise the temperature of the guide member to increase the positional displacement in the horizontal direction of the guiding portion of the guide member that is caused by thermal expansion of the guide member. As such, when a semiconductor device is to be inspected is heated in inspection, any positional displacement of the guiding portion of the guide member due to the thermal expansion of the guide member can be controlled to align the horizontal position of an electrode of the semiconductor device with that of the probe needle guided by the guide member. This ensures that the probe needle for a probe card can be brought into contact with the electrode on the semiconductor substrate and hence that the semiconductor device can be inspected.

Since the temperature adjusting member includes only the guide member heating member, the structure of the temperature adjusting member can be simplified, as compared with that which includes both the guide member heating member and the guide member cooling member.

In the semiconductor inspection device in one aspect of the present invention, the temperature controlling member may include the temperature adjusting member, the member which measures the temperature of the guide member, and a unit which provides ON/OFF control of the temperature adjusting member based on the measured temperature. Furthermore, the temperature adjusting member may have the guide member heating member. The temperature measuring member may include a temperature sensor and the guide member heating member may include a heater. The temperature sensor can measure the temperature of the guide member and the ON/OFF control of the heater can be provided according to the measured temperature to precisely control the temperature of the guide member and thus accurately control any positional displacement in the horizontal direction of the guiding portion of the guide member that is caused by thermal expansion of the guide member. As such, the horizontal position of an electrode of a semiconductor device to be inspected can be more precisely aligned with that of the probe needle guided by the guide member when the semiconductor device is heated in inspection. This ensures that the probe needle for a probe card can be brought into contact with the electrode of the semiconductor device and hence that the semiconductor device can be inspected.

A method of controlling a semiconductor inspection device in another aspect of the present invention is a method of controlling the temperature of the guide member of a semiconductor inspection device including a probe needle for a probe card, a guide member for positioning the probe needle, a member which measures the temperature of the guide member, and a temperature adjusting member having at least any one of a member which heats the guide member and a member which cools the guide member, and the method includes the step of measuring the temperature of the guide member, and the step of providing ON/OFF control of the temperature adjusting member based on the measured temperature. The measurement of the temperature of the guide member and the provision of the ON/OFF control of the temperature adjusting member according to the measured temperature can improve the precision in controlling the temperature of the guide member and thus more accurately control any positional displacement in the horizontal direction of the guiding portion of the guide member that is caused by thermal expansion of the guide member. Thus, the horizontal position of an electrode of a semiconductor device to be inspected can be more precisely aligned with that of the probe needle guided by the guide member when the semiconductor device is heated in inspection. This ensures that the probe needle for a probe card can be brought into contact with the electrode on the semiconductor substrate and hence that the semiconductor device can be inspected.

The method of controlling a semiconductor inspection device in another aspect of the present invention may provide the ON/OFF control so that a temperature T1 of the guide member in the semiconductor inspection is approximately equal to $(T-T3) \times a2/a1+T3$, wherein a1 represents the coefficient of linear expansion of the guide member, a2 represents the coefficient of linear expansion of the semiconductor substrate inspected by the semiconductor inspection device, T2 represents the temperature of the semiconductor substrate in semiconductor inspection, and T3 represents the temperature of the guide member and semiconductor substrate in aligning the position of an opening of the guide member for guiding the probe needle with the position of an electrode of the semiconductor substrate. Since temperature T1 of the guide member is adjusted to be nearly equal to $(T2-T3) \times a2/a1+T3$, any horizontal displacement of the opening of the guide member that is caused by thermal expansion of the guide member can be controlled to be nearly equal to that of the electrode on the semiconductor substrate that is caused by thermal expansion of the semiconductor substrate when the temperature of the semiconductor substrate is changed from T3 to temperature T2 in providing the semiconductor inspection. As such, the horizontal position of the probe needle guided by the opening can be approximately aligned with that of the electrode. This ensures that the probe needle for a probe card can be brought into contact with the electrode formed on the semiconductor substrate in the semiconductor inspection and thus that the semiconductor device can be inspected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the drawings.

First Embodiment

Figure 1:
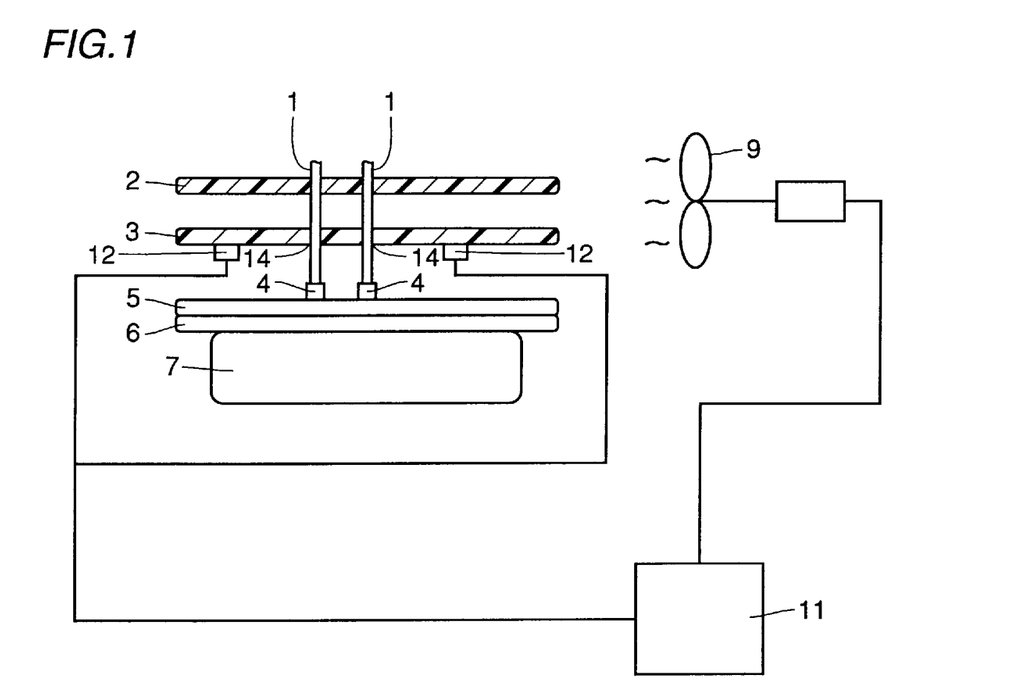
FIG. 1 schematically shows a semiconductor inspection device according to a first embodiment of the present invention.

Referring to FIG. 1, a semiconductor inspection device according to a first embodiment of the present invention includes a probe needle 1, a probe needle fixing guide plate 2, a probe needle positioning guide plate 3, a temperature sensor 12 for measuring the temperature of the positioning guide plate 3, a hot chuck 6 for fixing and heating a semiconductor substrate 5 to be inspected, a prober support 7, a cooling fan 9 for cooling positioning guide plate 3, and a control device 11 which provides ON/OFF control of cooling fan 9 according to the temperature of positioning guide plate 3 measured by temperature sensor 12. Hot chuck 6 is mounted on prober support 7. Semiconductor substrate 5 is fixed on hot chuck 6. An electrode 4 is formed on a surface of semiconductor substrate 5. Probe needle positioning guide plate 3 is positioned at a region over semiconductor substrate 5. An opening 14 is formed in a predetermined region of positioning guide plate 3. Probe needle fixing guide plate 2 is provided at a region over positioning guide plate 3. Probe needle 1 is fixed at a predetermined region of fixing guide plate 2. Probe needle 1 is inserted into opening 14 formed in the predetermined region of positioning guide plate 3 and is thus positioned such that it is aligned with the horizontal position of electrode 4 of semiconductor substrate 5 and is thus in contact with electrode 4 formed on semiconductor substrate 5. While temperature sensor 12 is provided on a lower surface of positioning guide plate 3, it may be provided on an upper surface of positioning guide plate 3. Temperature sensor 12 is connected to control device 11 by interconnection. Cooling fan 9 is connected to control device 11 which can provide ON/OFF control of cooling fan 9. It should be noted that positioning guide plate 3 is formed of a material having a coefficient of linear expansion larger than the coefficient of linear expansion of semiconductor substrate 5, such as resin and typical ceramics. Opening 14 formed in positioning guide plate 3 is formed by holding the temperature of positioning guide plate 3 and semiconductor substrate 5 at a room temperature (25° C.), fixing and positioning positioning guide plate 3 over semiconductor substrate 5, and removing with e.g. a drill that portion of positioning guide plate 3 which is located at the region located exactly above electrode 4 formed on semiconductor substrate 5. In inspecting the electrical characteristics of a semiconductor device formed on semiconductor substrate 5, semiconductor substrate 5 is heated by hot chuck 6 and is thus set at a set temperature in conducting the inspection, e.g. 80° C. Meanwhile, the heat is also transferred to positioning guide plate 3 via the ambient gas around hot chuck 6 and semiconductor substrate 5 and the temperature of positioning guide plate 3 is also raised accordingly. Accordingly, temperature sensor 12 provided at positioning guide plate 3, control device 11 and cooling fan 9 are used to control the temperature of positioning guide plate 3 to achieve equalization of the positional displacement in the horizontal direction of electrode 4 due to thermal expansion of semiconductor substrate 5 and the positional displacement in the horizontal direction of opening 14 due to thermal expansion of positioning guide plate 3 that are attributed to the temperature of semiconductor substrate 5 raised from 25° C. to 80° C.

Since the semiconductor inspection device according to the first embodiment of the present invention is provided with cooling fan 9 for controlling the temperature of positioning guide plate 3, the temperature of positioning guide plate 3 can be controlled to be the set temperature determined depending on the material of positioning guide plate 3. This allows controlling any positional displacement in the horizontal direction of opening 14 in semiconductor inspection that is attributed to thermal expansion of positioning guide plate 3, and the tip of probe needle 1 inserted into opening 14 can be aligned with the position of electrode 4 formed on semiconductor substrate 5. This ensures that the semiconductor device can be inspected.

Since temperature sensor 12 is provided on a lower surface of positioning guide plate 3 and control device 11 provides ON/OFF control of cooling fan 9 according to the data on the temperature of positioning guide plate 3 measured by temperature sensor 12, the precision in controlling the temperature of positioning guide plate 3 can further be improved and this allows more accurate control of any positional displacement in the horizontal direction of opening 14 that is caused by thermal expansion of positioning guide plate 3.

Figure 2:
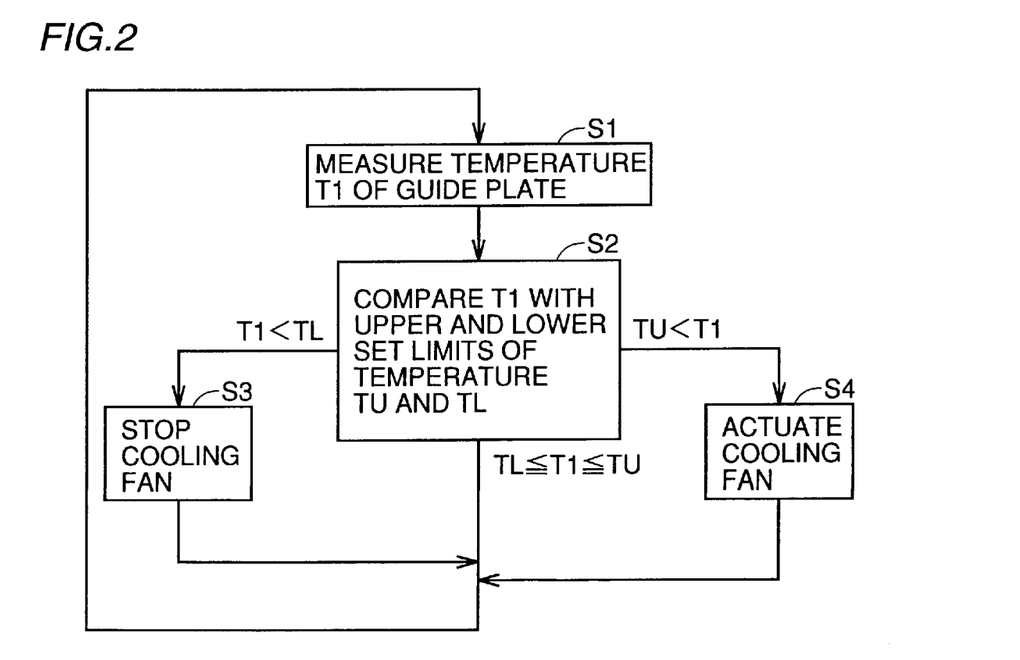
FIG. 2 is a control flow chart of a method of controlling the temperature of the probe needle positioning guide plate of the semiconductor inspection device according to the first embodiment shown in FIG. 1.

FIG. 2 represents a control flow of a method of controlling the temperature of positioning guide plate 3 in the first embodiment of the present invention. According to this control flow, a temperature T1 of positioning guide plate 3 (shown in FIG. 1) is measured by temperature sensor 12 (shown in FIG. 1) in the step 1 (S1) and is then transmitted to control unit 11 (shown in FIG. 1) and compared with upper and lower set limits TU and TL of the temperature of positioning guide plate 3, as indicated in step 2 (S2). If temperature T1 of positioning guide plate 3 is lowered than lower set limit TL of the temperature, cooling fan 9 (shown in FIG. 1) is stopped, as indicated in step 3 (S3). If temperature T1 of positioning guide plate 3 is higher than upper set limit TU of the temperature, cooling fan 9 is actuated, as indicated in step 4 (S4). If temperature T1 of positioning guide plate 3 is no less than lower set limit TL of the temperature and no more than upper set limit TU of the temperature, the controlling command for cooling fan 9 is not changed and the control flow returns to step 1 (S1). It should be noted that upper and lower set limits TU and TL of the temperature of positioning guide plate 3 are determined so that opening 14 (shown in FIG. 1) is positioned over electrode 4 (shown in FIG. 1) formed on semiconductor substrate 5 (shown in FIG. 1). This ensures that the semiconductor device can be inspected.

Such a control flow as shown in FIG. 2 also allows upper and lower set limits TU and TL of the temperature of positioning guide plate 3 to be adjusted when a set temperature of semiconductor substrate 5 in semiconductor inspection shown in FIG. 1 is changed or the material and hence coefficient of linear expansion of positioning guide plate 3 is changed, and thus ensures that probe needle 1 is brought into contact with electrode 4 and hence that the semiconductor device can be inspected.

Second Embodiment

Figure 3:
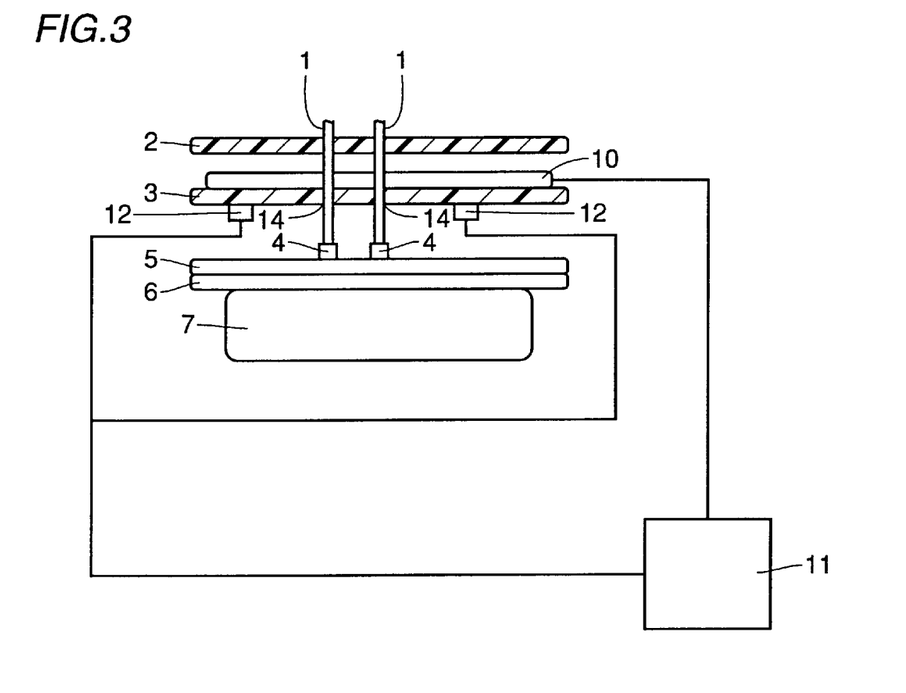
FIG. 3 schematically shows a semiconductor inspection device according to a second embodiment of the present invention.

Referring to FIG. 3, a semiconductor inspection device according to a second embodiment of the present invention is basically similar in configuration to that of the first embodiment of the present invention shown in FIG. 1, except that it is provided with a heater 10 for heating positioning guide plate 3 in place of cooling fan 9 (shown in FIG. 1). Furthermore, positioning guide plate 3 is formed of a material having a coefficient of linear expansion no greater than that of semiconductor substrate 5, such as a silicon wafer or ceramics containing boron nitride. Heater 10 is connected to control device 11 which can provides ON/OFF control of heater 10. It should be noted that, as has been described above, positioning guide plate 3 is formed of a material having a coefficient of linear expansion smaller than the coefficient of linear expansion of semiconductor substrate 5. Opening 14 formed in positioning guide plate 3 is formed by holding the temperature of positioning guide plate 3 and semiconductor substrate 5 at a room temperature (25° C.), fixing and positioning positioning guide plate 3 over semiconductor substrate 5, and removing with e.g. a drill that portion of positioning guide plate 3 which is located at the region located exactly above electrode 4 formed on semiconductor substrate 5. In inspecting the electrical characteristics of a semiconductor device formed on semiconductor substrate 5, semiconductor substrate 5 is heated by hot chuck 6 and is thus set at a set temperature in conducting the inspection, e.g. 80° C. In the meantime, the heat is also transferred to positioning guide plate 3 via the ambient gas around hot chuck 6 and semiconductor substrate 5 and the temperature of positioning guide plate 3 is thus raised. Accordingly, temperature sensor 12 provided at positioning guide plate 3, control device 11 and heater 10 are used to control the temperature of positioning guide plate 3 to achieve equalization of the positional displacement in the horizontal direction of electrode 4 due to thermal expansion of semiconductor substrate 5 and the positional displacement in the horizontal direction of opening 14 due to thermal expansion of positioning of guide plate 3 that are attributed to the temperature of semiconductor substrate 5 raised from 25° C. to 80° C.

Since the semiconductor inspection device according to the second embodiment of the present invention is provided with heater 10 which is in contact with positioning guide plate 3, the temperature of positioning guide plate 3 can be controlled to be a predetermined set temperature. This allows controlling any positional displacement in the horizontal direction of opening 14 that is attributed to thermal expansion of positioning guide plate 3 in semiconductor inspection. Accordingly, the tip of probe needle 1 inserted into opening 14 can be aligned with the position of electrode 4 formed on semiconductor substrate 5 and this ensures that the semiconductor device can be inspected.

Furthermore, the provision of temperature sensor 12 in contact with positioning guide plate 3 allows temperature sensor 12 to measure the temperature of positioning guide plate 3 and transmit the measured temperature to control device 11. Based the temperature of positioning guide plate 3 measured by temperature sensor 12, control device 11 can provide ON/OFF control of heater 10 to improve the precision in controlling the temperature of positioning guide plate 3. This allows accurate control of any positional displacement in the horizontal direction of opening 14 that is caused by thermal expansion of positioning guide plate 3.

Figure 4:
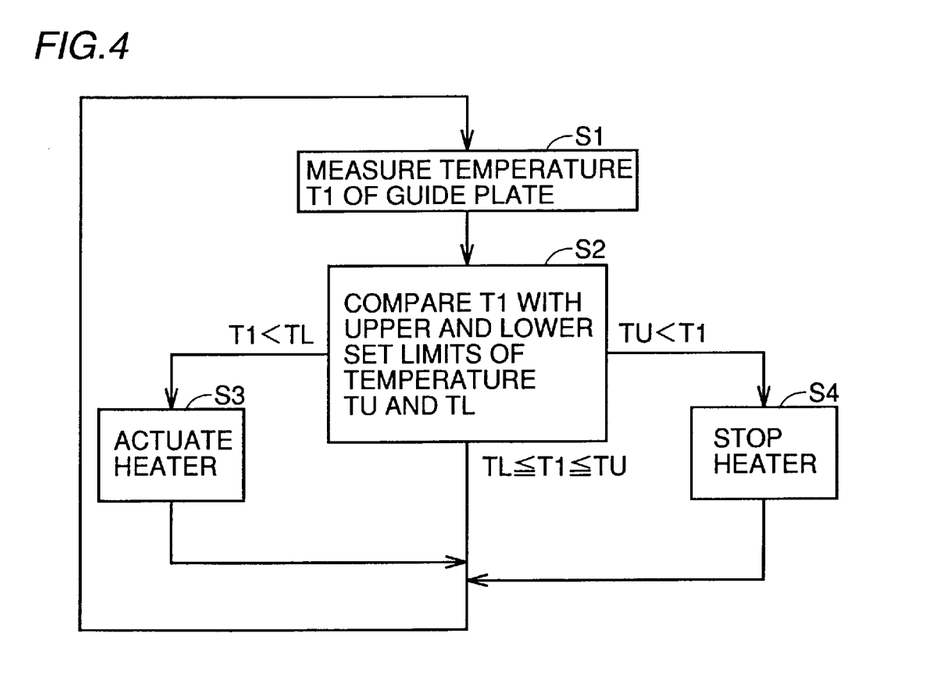
FIG. 4 is a control flow chart of a method of controlling the temperature of the probe needle positioning guide plate of the semiconductor inspection device according to the second embodiment shown in FIG. 3.

The control flow for controlling the temperature of positioning guide plate 3 shown in FIG. 4 is basically similar to the FIG. 2 control flow for controlling the temperature of positioning guide plate 3 (shown in FIG. 1) of the semiconductor inspection device according to the first embodiment of the present invention. In the flow for controlling the temperature of positioning guide plate 3 according to the second embodiment shown in FIG. 4, however, heater 10 (shown in FIG. 3) is actuated when a measured temperature T1 of positioning guide plate 3 (shown in FIG. 3) is lower than lower set limit TL of the temperature, as indicated in step 3 (S3), and heater 10 is stopped when a measured temperature T1 of positioning guide plate 3 is higher than upper set limit TU of the temperature, as indicated in step 4 (S4). Since the ON/OFF control of heater 10 is provided according to the measured temperature T1 of positioning guide plate 3, the temperature of positioning guide plate 3 can be controlled more precisely.

Figure 5:
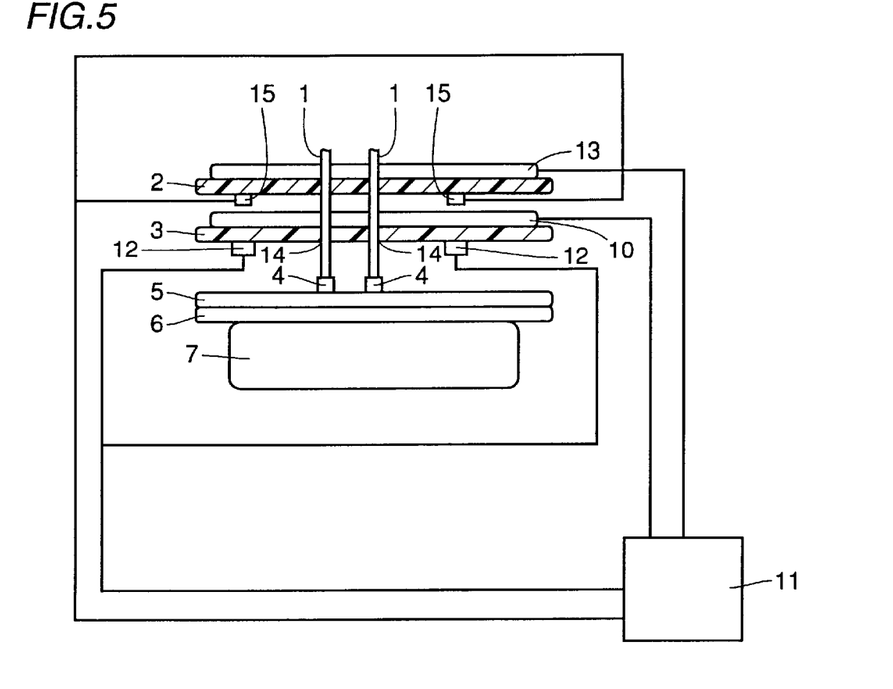
FIG. 5 schematically shows a semiconductor inspection device as a variation of the second embodiment of the present invention shown in FIG. 3.

A semiconductor inspection device as a variation of the second embodiment of the present invention shown in FIG. 5 is basically similar in configuration to the semiconductor inspection device according to the second embodiment shown in FIG. 3. In the semiconductor inspection device according to the second embodiment of the present invention shown in FIG. 5, however, probe needle fixing guide plate 2 is also provided with a temperature sensor 15 and a heater 13 which are connected to control device 11. Temperature sensor 15 measures the temperature of probe needle fixing guide plate 2 and control device 11 can provide ON/OFF control of heater 13 according to the measured temperature. Since the semiconductor inspection device as a variation of the second embodiment of the present invention is also provided with temperature sensor 15 and heater 13 provided for probe needle fixing guide plate 2, the temperature of probe needle fixing guide plate 2 can be controlled as well as that of positioning guide plate 3. As such, any positional displacement of fixing guide plate 2 due to thermal expansion of fixing guide plate 2 in semiconductor inspection can be controlled so that the region at which probe needle 1 is fixed in fixing guide plate 2 is positioned exactly above electrode 4. Accordingly, the tip of probe needle 1 can be more accurately controlled so that it is positioned exactly above electrode 4.

Third Embodiment

Figure 6:
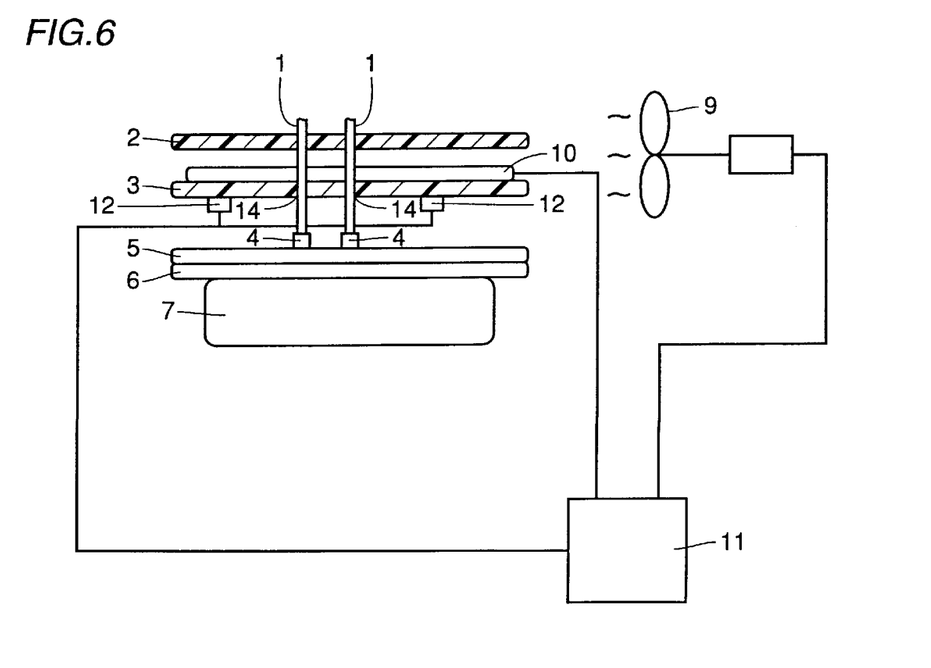
FIG. 6 schematically shows a semiconductor inspection device according to a third embodiment of the present invention.

A semiconductor inspection device according to a third embodiment of the present invention shown in FIG. 6 is basically similar in configuration to the semiconductor inspection device according to the first embodiment of the present invention. In the semiconductor inspection device according to the third embodiment, however, positioning guide plate 3 is provided with heater 10 connected to control device 11 which provides ON/OFF control of heater 10 and cooling fan 9 based on the temperature of positioning guide plate 3 measured by temperature sensor 12. Since the semiconductor inspection device according to the third embodiment of the present invention is provided with heater 10 for heating positioning guide plate 3 and cooling fan 9 for cooling positioning guide plate 3, hunting of the temperature of positioning guide plate 3 and the like can be prevented by using both heater 10 and cooling fan 9 and the temperature of positioning guide plate 3 can be controlled more precisely. This allows more precise control of any positional displacement of opening 14 formed in positioning guide plate 3 that is caused by thermal expansion of positioning guide plate 3, and further ensures that probe needle 1 inserted in opening 14 is brought into contact with electrode 4 formed on semiconductor substrate 5 and hence that the semiconductor can be inspected.

Figure 7:
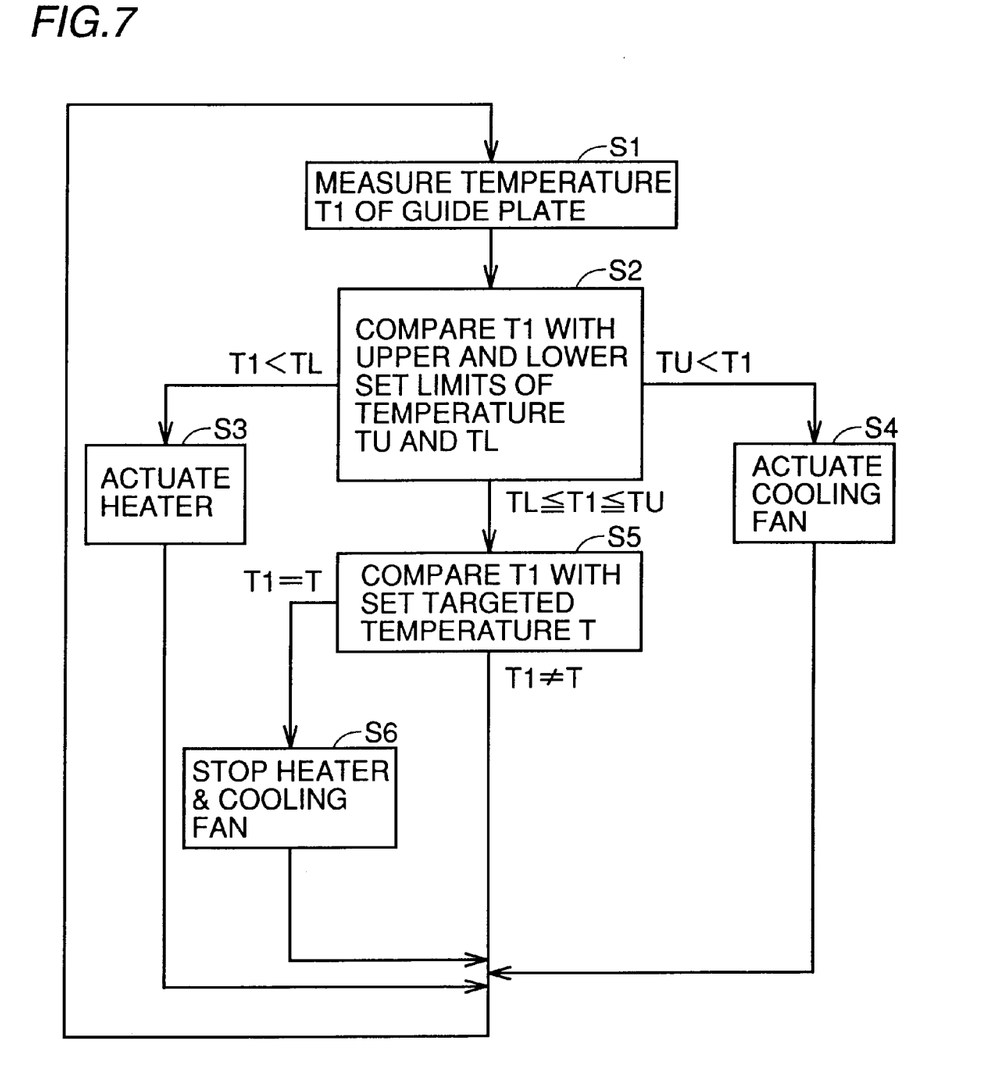
FIG. 7 is a control flow chart of a method of controlling the temperature of the probe needle positioning guide plate of the semiconductor inspection device according to the third embodiment of the present invention shown in FIG. 6.

Referring to FIG. 7, temperature T1 of probe needle positioning guide plate 3 (shown in FIG. 6) is measured in step 1 (S1). Then, the measured temperature T1 of positioning guide plate 3 is compared with upper set limit of temperature TU and lower set limit of temperature TL in step 2 (S2). If the measured temperature T1 is lower than lower set limit of temperature TL, heater 10 (shown in FIG. 6) is actuated, as indicated in step 3 (S3). If the measured temperature T1 of positioning guide plate 3 is higher than upper set limit of temperature TU, cooling fan 9 (shown in FIG. 6) is actuated, as indicated in step 4 (S4). If the measured temperature T1 of positioning guide plate 3 is no less than lower set limit of temperature TL and no greater than upper set limit of temperature TU, the measured temperature T1 of positioning guide plate 3 is then compared with a set targeted temperature T of positioning guide plate 3, as indicated in step 5 (S5). If the measured temperature T1 is the same as set targeted temperature T, heater 10 and cooling fan 9 are stopped, as indicated in step 6 (S6). If the measured temperature T1 is different from set targeted temperature T, the control commands for heater 10 and cooling fan 9 are not changed and control returns to step 1 (S1). It should be noted that set targeted temperature T is given by the expression $(80-25) \times a2/a1 + 25° C.$, wherein a1 represents the coefficient of linear expansion of positioning guide plate 3, a2 represents the coefficient of linear expansion of semiconductor substrate 5, the temperature of semiconductor substrate 5 in semiconductor inspection is 80° C., and the temperature of positioning guide plate 3 and semiconductor substrate 5 is set at 25° C. in aligning the position of opening 14 of positioning guide plate 3 with the position of electrode 4 on semiconductor substrate 5. Upper and lower set limits of temperature TU and TL are also set based on the ratio between the size of electrode formed on semiconductor substrate 5 and the diameter of the tip of probe needle 1, the precision of processing opening 14 formed in positioning guide plate 3 and the like such that the tip of probe needle 1 is not displaced from the region over electrode 4. The temperature of positioning guide plate 3 can thus be controlled to position opening 14 of positioning guide plate 3 precisely over electrode 4 in the horizontal direction. Accordingly, the tip of probe needle 1 inserted in opening 14 formed in positioning guide plate 3 can be more accurately controlled to be aligned with the position of electrode 4 formed on semiconductor substrate 5 and this further ensures that the semiconductor device is inspected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor inspection device comprising:
   a probe needle for use with a probe card contacting an electrode of a semiconductor device manufactured at a semiconductor substrate;
   a guide member used for positioning said probe needle having a coefficient of linear expansion larger than said semiconductor substrate; and
   a cooling member cooling said guide member.

2. The semiconductor inspection device according to claim 1, wherein said cooling member includes:
   a member measuring a temperature of said guide member; and
   means for providing ON/OFF control of said cooling member based on a measured temperature of said guide member.

3. The semiconductor inspection device according to claim 2, wherein:
   said cooling member provides said ON/OFF control so that a temperature T1 of said guide member in providing a semiconductor inspection is approximately equal to $(T2-T3) \times a2/a1 + T3$, wherein a1 represents a coefficient of linear expansion of a material forming said guide member, a2 represents a coefficient of linear expansion of a semiconductor substrate inspected by said semiconductor inspection device, T2 represents a temperature of said semiconductor substrate when conducting said semiconductor inspection, and T3 represents a temperature of said guide member and of said semiconductor substrate when determining a position of an opening formed in said guide member for guiding said probe needle so that said position of said opening is aligned with a position of an electrode formed on said semiconductor substrate.

4. The semiconductor inspection device according to claim 1, wherein:
   said cooling member includes:
   a cooling fan;
   a member measuring a temperature of said guide member; and
   means for providing ON/OFF control of said cooling member based on a measured temperature of said guide member.

5. A semiconductor inspection device comprising:
   a probe needle for use with a probe card contacting an electrode of a semiconductor device manufactured at a semiconductor substrate;
   a guide member used for positioning said probe needle, having a coefficient of linear expansion not larger than said semiconductor substrate; and
   a heating member heating said guide member.

6. The semiconductor inspection device according to claim 5, wherein said heating member includes:
   a member measuring a temperature of said guide member; and
   means for providing ON/OFF control of said heating member based on a measured temperature of said guide member.

7. The semiconductor inspection device according to claim 6, wherein:
   said heating member provides said ON/OFF control so that a temperature T1 of said guide member in providing a semiconductor inspection is approximately equal to $(T2-T3) \times a2/a1+T3$, wherein a1 represents a coefficient of linear expansion of a material forming said guide member, a2 represents a coefficient of linear expansion of semiconductor substrate inspected by said semiconductor inspection device, T2 represents a temperature of said semiconductor substrate when conducting said semiconductor inspection, and T3 represents a temperature of said guide member and of said semiconductor substrate when determining a position of an opening formed in said guide member for guiding said probe needle so that said position of said opening is aligned with a position of an electrode formed on said semiconductor substrate.

8. The semiconductor inspection device according to claim 5, wherein:
said heating member includes:
a heater;
a member measuring a temperature of said guide member; and
means for providing ON/OFF control of said heating member based on a measured temperature of said guide member.

9. A method of controlling a temperature of a guide member of a semiconductor inspection device including a probe needle for use with a probe card, contacting an electrode of a semiconductor device manufactured at a semiconductor substrate, a guide member used for positioning said probe needle, having a coefficient of linear expansion larger than said semiconductor substrate, and a cooling member cooling said guide member, the method comprising the steps of:
measuring a temperature of said guide member; and
ON/OFF controlling said cooling member, based on said temperature measured.

10. The method of controlling the semiconductor inspection device according to claim 9, wherein:
said ON/OFF control is provided so that a temperature T1 of said guide member in conducting a semiconductor inspection is approximately equal to $(T2-T3) \times a2/a1+T3$, wherein a1 represents a coefficient of linear expansion of said guide member, a2 represents a coefficient of linear expansion of a semiconductor substrate inspected by said semiconductor inspection device, T2 represents a temperature of said semiconductor substrate when conducting said semiconductor inspection, and T3 represents a temperature of said guide member and of said semiconductor substrate when determining a position of an opening formed in said guide member for guiding said probe needle such that said position of said opening is aligned with a position of an electrode formed on said semiconductor substrate.

11. A method of controlling a temperature of a guide member of a semiconductor inspection device including a probe needle for use with a probe card, contacting an electrode of a semiconductor device manufactured at a semiconductor substrate, a guide member used for positioning said probe needle, having a coefficient of linear expansion not larger than said semiconductor substrate, and a heating member heating said guide member, the method comprising the steps of:
measuring a temperature of said guide member; and
ON/OFF controlling said heating member, based on said temperature measured.

12. The method of controlling the semiconductor inspection device according to claim 11, wherein:
said ON/OFF control is provided so that a temperature T1 of said guide member in conducting a semiconductor inspection is approximately equal to $(T2-T3) \times a2/a1+T3$, wherein a1 represents a coefficient of linear expansion of said guide member, a2 represents a coefficient of linear expansion of semiconductor substrate inspected by said semiconductor inspection device, T2 represents a temperature of said semiconductor substrate when conducting said semiconductor inspection, and T3 represents a temperature of said guide member and of said semiconductor substrate when determining a position of an opening formed in said guide member for guiding said probe needle such that said position of said opening is aligned with a position of an electrode formed on said semiconductor substrate.

* * * * *